United States Patent [19]

Walker et al.

[11] 4,197,552
[45] Apr. 8, 1980

[54] LUMINESCENT SEMICONDUCTOR DEVICES

[75] Inventors: Laurence G. Walker, Dover; George W. Pratt, Jr., Wayland, both of Mass.

[73] Assignee: Massachusetts Institute of Technology, Cambridge, Mass.

[21] Appl. No.: 586,461

[22] Filed: Jun. 12, 1975

[51] Int. Cl.² ............................................ H01L 33/00
[52] U.S. Cl. ........................................ 357/17; 357/4; 357/6; 357/23; 357/54
[58] Field of Search ............... 357/23, 4, 61, 30, 54, 357/18, 17, 26, 6

[56] References Cited

U.S. PATENT DOCUMENTS

| | | | |
|---|---|---|---|
| 3,267,317 | 8/1966 | Fischer | 313/108 |
| 3,353,114 | 11/1967 | Hanks | 331/94.5 |
| 3,385,731 | 5/1968 | Weiner | 117/212 |
| 3,405,331 | 10/1968 | Skolski | 317/235 |
| 3,492,548 | 6/1970 | Goodman | 317/235 |
| 3,535,598 | 10/1970 | Feist | 317/234 |
| 3,675,150 | 7/1972 | Harris | 331/94.5 |
| 3,728,784 | 4/1973 | Schmidt | 29/578 |

Primary Examiner—Martin H. Edlow
Attorney, Agent, or Firm—Arthur A. Smith, Jr.; Robert Shaw

[57] ABSTRACT

Luminescent semiconductor device having a wide-gap semiconductor material substrate (e.g., ZnS), a thin (≲100Å thick) alkali halide insulating layer (e.g., NaI, KI, LiI) in the substrate and a metal layer on the insulating layer such that the insulating layer is sandwiched between the substrate and the metal layer. The device emits light in the blue and in the green regions of the electromagnetic spectrum.

6 Claims, 8 Drawing Figures

LUMINESCENT SEMICONDUCTOR DEVICES

The invention herein described was made in the course of work under a contract of the Department of the Army, Army Research Office, Durham, an agency of the United States Government.

The present invention relates to luminescent semiconductor devices having metal-insulator-semiconductor (MIS) structure.

There accompanies herewith a copy of the doctoral thesis of the inventor Walker, entitled "Tunnel Injection Electroluminescence and Long Term Charge Storage in ZnS MIS Structures"; the thesis is based upon work done under the supervision of the inventor Pratt, Jr. and deposited in the library system of the Massachusetts Institute of Technology on or about July 9, 1975; the thesis is hereby incorporated herein by reference. Attention is called also to an application for Letters Patent Ser. No. 543,602, filed Jan. 23, 1975 (Walker), now U.S. Pat. No. 3,987,474.

Light emitting diodes (LEDs) in widespread use emit light in the red and the green regions of the electromagnetic spectrum, but a good blue emitter is not presently available. It is an object of the present invention to provide a novel luminescent semiconductor device.

A further object is to provide a luminescent semiconductor device that emits radiation in the blue region of the electromagnetic spectrum.

A still further object of the invention is to provide a luminescent semiconductor device that emits radiation in the green region of the electromagnetic spectrum.

Another object of the invention is to provide a device that can sense radiation in the ultraviolet region of the electromagentic spectrum.

Still another object of the invention is to provide a new semiconductor laser device.

A still further object is to provide a semiconductor device operable to modulate light by means of an acoustic wave.

These and still further objects are discussed hereinafter and are delineated in the appended claims.

The foregoing objects are achieved in a semiconductor crystalline device that includes a wide-gap semiconductor material forming a substrate, a thin ($\lesssim$100 Å thick) layer of insulating material having a low electron affinity formed on the substrate and a metal layer formed on the layer of insulating material such that the insulating material is sandwiched between the substrate and the metal layer.

The invention is hereinafter described with reference to the accompanying drawing in which.

Figure 1:
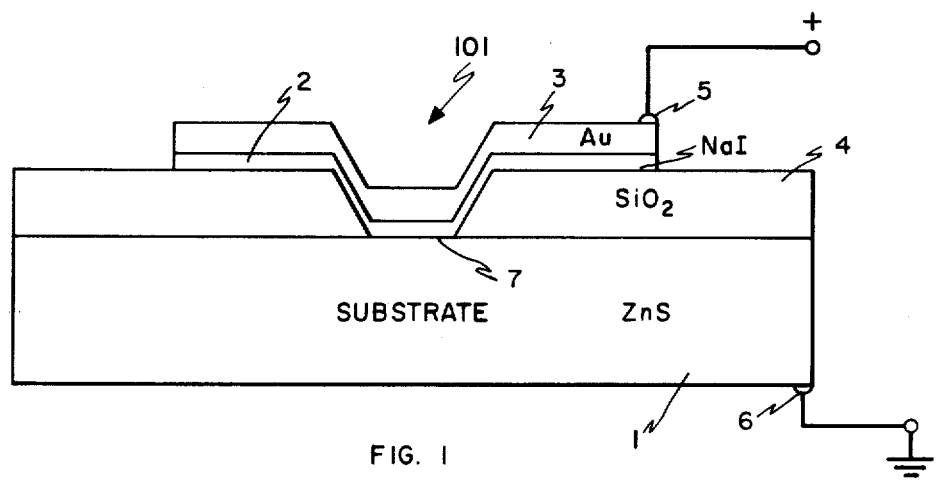
FIG. 1 is a diagrammatic elevation view of a semiconductor device that embodies the present inventive concepts and is a sandwich structure having a thin alkali halide (NaI) insulating layer formed between a wide-gap semiconductor substrate (ZnS) and a metal layer (Au) with a masking layer (SiO$_2$) to protect the active region of the device.
Figure 2:
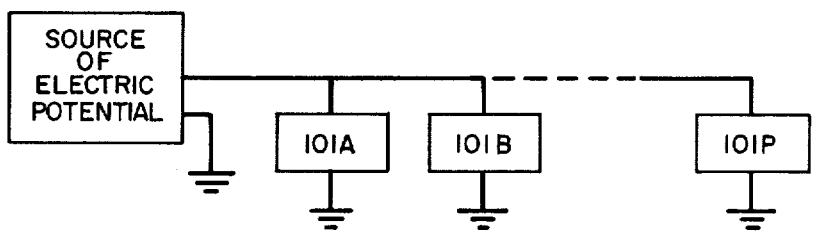
FIG. 2 shows a plurality of devices, like the device in FIG. 1, powered by a source of electron electric potential.

The semiconductor crystalline device labeled 101 in FIG. 1 embodies the inventive concepts herein disclosed. The device 101 includes a wide-gap semiconductor substrate 1, a thin layer of insulating material 2 having a low electron affinity formed on the substrate and a metal layer 3 on the insulating layer 2 such that the insulating layer is sandwiched between the substrate 1 and the metal layer 3. The device 101, as later discussed, also includes a masking layer 4. The device discussed in greatest detail herein is one that luminesces when there is applied to it a forward bias as indicated. The bias is applied through contacts 5 and 6 in the structure of FIG. 1. There follows now a detailed discussion of the device 101 for use in the luminescent mode of operation.

The semiconductor material in the layer 1 is a II–VI material and preferably ZnS. The insulating layer 2 is an alkali halide having a small band gap, such as, for example, sodium iodide (NaI), potassium iodide (KI) or lithium iodide (LiI), which have the respective band gap $E_g$ of 5.8, 6.2 and 5.9 electron volts. The metal layer 3 is formed of a metal that has a high work function; gold and platinum work well. The metal layer 3 serves as a hole-injecting electrode, but it can serve as a heat sink, as well. Good heat sinking is necessary because a large amount of heat is generated in the thin (and thus low volume) insulating layer.

One difficulty encountered in the devices fabricated in connection with the thesis work was traced to the diffusion of moisture from the surrounding atmosphere to the active junction region marked 7 between the insulating layer 2 and the substrate 1. The masking layer 4 of SiO$_2$ serves to prevent atmospheric moisture from reaching the alkali halide insulating layer 2 and dissolving the same. The masking layer is interposed between the alkali halide layer 2 and the substrate 1 at all points between the two, except at the internally located active region 7 at which luminescence occurs.

The underlying theory and detailed mathematics regarding the theory of operation of the device is contained in the thesis. Some aspects of that theory are now given with reference to FIGS. 3A, 3B, 4 and 5.

Figure 3A:
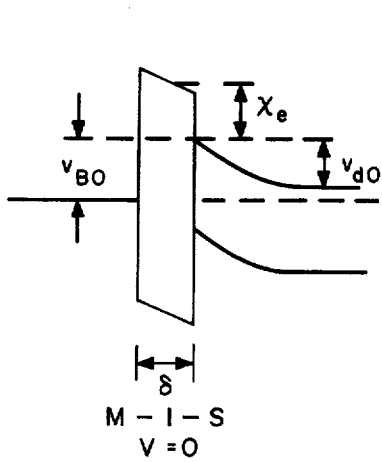
FIG. 3A is the energy band picture of the semiconductor device at thermal equilibrium.
Figure 3B:
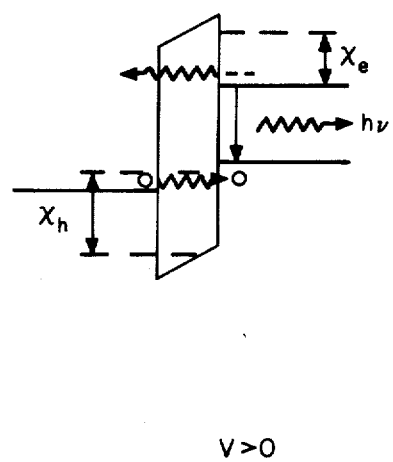
FIG. 3B is the energy band picture of the semiconductor device under forward bias.

In FIG. 3B, the device structure is shown under forward bias. It is seen that the principal current components are (i) the (tunnel) injection of holes from empty states in the metal into the valence band of the semiconductor, and (ii) the extraction of electrons from the conduction band of the semiconductor into empty states in the metal. The light-producing current component is the hole component, and the object is to increase that component at the expense of the other one. It is further seen in FIG. 3B that the barrier height to hole flow is the quantity labeled $\chi_h$ and the barrier height to electron flow is the quantity labeled $X_e$. Since tunnel currents are exponentially dependent on the barrier height [essentially as exponent $(-\chi^{\frac{1}{2}}\delta]$, the hole component can be enhanced by minimizing $\chi_h$ and the electron component diminished by maximizing $\chi_e$.

The barrier heights are determined by the material parameters of the insulator, relative to those of the metal and the semiconductor.

Figure 4:
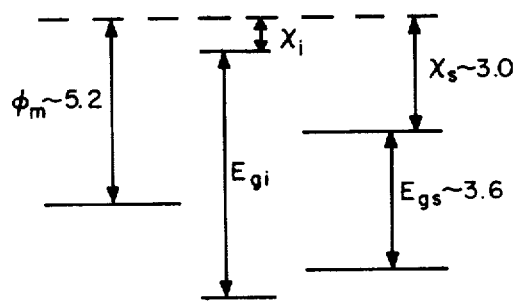
FIG. 4 is a schematic energy band picture of the semiconductor device showing how the bands match up relative to the vacuum level.

In FIG. 4, it can be seen that $\chi_e$ can be approximated by the difference between $\chi_s$ and $\chi_i$, the electron affinities of the semiconductor and insulator, respectively. $\chi_h$ can be approximated by the energy difference between the metal fermi level and the semiconductor valence band edge, or $\chi_i + E_{gi} - \phi_m$. To maximize $\chi_e$, then, an insulator with a low electron affinity is desired. Further, to minimize $\chi_h$, an insulator with a small band gap is desired.

It has been reported that alkali halides posses a low electron affinity, about 0.4 eV. Using that figure, it can be shown that any value for $E_{gi}$ less than 7.4 eV would result in a lower value for $\chi_h$ than for $\chi_e$ and thus in an efficient emitting structure. Fortunately, LiI, KI, and NaI are three alkali halides which posses band gaps lower than 7.4 eV, and diodes using these three materials have been fabricated and observed to emit visible light.

Figure 5:
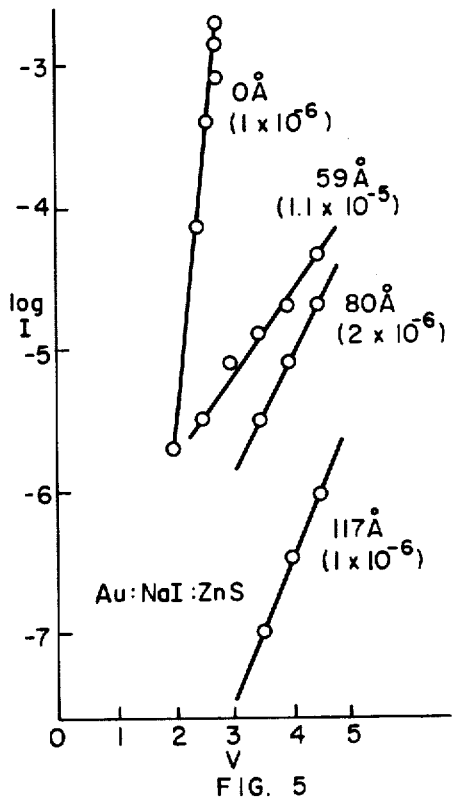
FIG. 5 shows the measured current-voltage characteristics of four devices w/ various insulator layer thicknesses, as marked (the number in parentheses is the measured external quantum efficiency of each diode)

The experimental current-voltage characteristics of diodes with NaI insulating layers are shown in FIG. 5 along with their measured external quantum efficiencies.

The thesis contains detailed information on the fabrication of devices like the device 101, as well as a list of reference works to serve as background in this and other respects. The fabrication process used consisted of the thermal evaporation of thin alkali halide films onto prepared ZnS substrates and the subsequent evaporation of the metal film in situ. Substrate preparation was extensive including ohmic contacting, clearing, various solvent cleaning steps, and the SiO$_2$ masking process described above.

Figure 6:
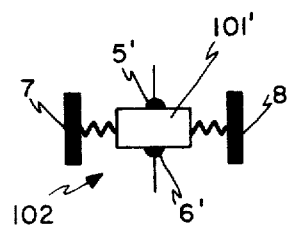
FIG. 6 shows schematically a solid state laser that comprises a device like that in FIG. 1 but includes, as well, a resonant cavity.

The semiconductor device 102 in FIG. 6 is a solid state laser that includes a luminescent semiconductor element similar to the device 101, and mirrors 7 and 8 that act in combination to form a resonant cavity. (See U.S. Pat. No. 3,676,795, Pratt, Jr.) Of course, the crystalline device 101, properly cleaved, can contain the necessary laser cavity to permit laser action.

Figure 7:
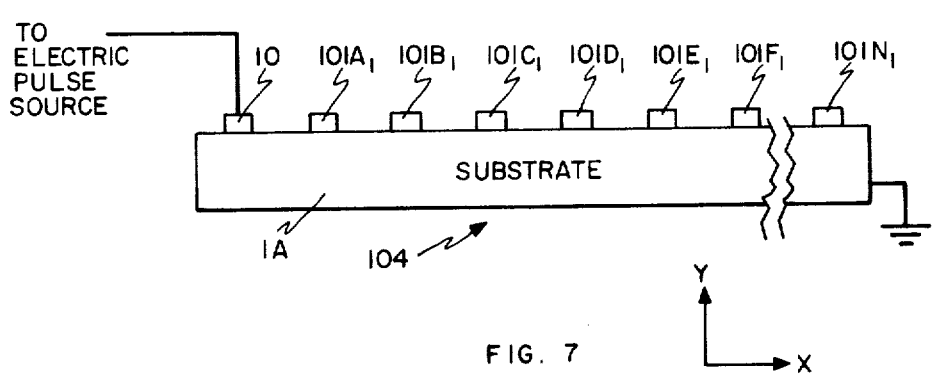
FIG. 7 is a schematic representation showing a plurality of devices, like the device of FIG. 1, except all having a common substrate, and an acoustic transducer attached to the same substrate.

The unit shown at 104 in FIG. 7 consists of a plurality of luminescent semiconductor crystalline devices 101A$_1$, 101B$_1$ ... 101N$_1$ that have a common piezoelectric substrate 1A (e.g., ZnS). An acoustic transducer 10 is operable to produce acoustic surface waves that propagate along the substrate in the x-direction and create, thereby, electric field regions in the substrate. The field regions also move in the x-direction and modulate radiation from the devices 101A$_1$ ... in passing. Also, standing acoustic waves can be produced. The acoustic transducer 10 is energized by a source of electric pulses or the like, not shown.

The device 101 is described in terms of its luminescent characteristics, but it can function, as well, as a detector to detect radiation in either the ultraviolet or the blue portion, for example, of the electromagnetic spectrum. Also, both functions can be accomplished by a single device.

Further modifications of the invention herein described will occur to persons skilled in the art, and all such modifications are deemed to be within the spirit and scope of the invention as defined in the appended claims.

What is claimed is:

1. An MIS luminescent semiconductor crystalline device, that comprises: a wide-gap semiconductor material forming a substrate; a thin insulating layer on the substrate, said thin insulating layer comprising a narrow energy gap alkali halide such that hole tunneling can occur therethrough into the valence band of the semiconductor and having a low electron affinity in order to inhibit the transfer of electrons from the semiconductor conduction band, said thin insulating layer being no more than approximately 100 Å thick; said alkali halide insulating layer having a band gap less than about 7.4 eV; and a metal layer on the insulating layer such that the insulating layer is sandwiched between the substrate and the metal layer.

2. A luminescent semiconductor device as claimed in claim 1 in which the alkali halide is taken from the group consisting essentially of sodium iodide (NaI), potassium iodide (KI) and lithium iodide (LiI) which have the respective band gaps $E_{gi}$ of 5.8, 6.2 and 5.9 electron volts.

3. An MIS luminescent semiconductor crystalline device, that comprises: a wide-gap semiconductor material forming a substrate; a thin insulating layer on the substrate, said thin insulating layer comprising a narrow energy gap alkali halide such that hole tunneling can occur therethrough into the valence band of the semiconductor and having a low electron affinity in order to inhibit the transfer of electrons from the semiconductor conduction band, the band gap of the alkali halide insulating layer being less than 7.4 eV and the electron affinity being about 0.4 eV; and a metal layer on the insulating layer such that the insulating layer is sandwiched between the substrate and the metal layer.

4. A semiconductor crystalline device that comprises wide-gap semiconductor substrate means; thin insulating layer means formed on the substrate means, said thin insulating layer means comprising an alkali halide having a small band gap and low electron affinity, the band gap of the alkali halide being less than 7.4 eV and the electron affinity of the alkali halide being no greater than about 0.4 eV; and metal layer means formed on the insulating layer means such that the insulating layer means is sandwhched between the substrate means and the metal layer means; said crystalline device being adapted to receive a forward bias and when so biased being operable to luminesce by injection of holes from empty states in the metal of the metal layer means into the valence band of the semiconductor of the semiconductor substrate means by tunneling through the thin insulating layer means.

5. A device as claimed in claim 4 in which the band gap of the material of which the semiconductor substrate consists is about 3.6 eV.

6. For use as a luminescent device to emit visible light, metal-insulating-semiconductor (MIS) structure crystalline means to receive a bias and adapted to luminesce when so biased and having, in combination, wide-gap semiconductor substrate means, the material of which the semiconductor substrate means consists being at least about 3.6 eV; thin insulating means formed on the substrate means, said thin insulating means comprising an alkali halide layer <100 Å and having a small band gap and low electron affinity to permit selective passage of the hole component of current through the insulating layer means, the band gap of the alkali halide being less than 7.4, and the electron affinity of the alkali halide being no greater than about 0.4 eV; and metal layer means formed on the insulating layer means such that the insulating layer means is sandwiched between the substrate means and the metal layer means, the metal of which the metal layer means consists having a high work function, light-producing current occurring between the substrate means and the metal layer means through said thin insulating layer means when the device is biased, the light producing current being the hole component.

* * * * *